(12) United States Patent
You et al.

(10) Patent No.: US 10,663,522 B2
(45) Date of Patent: May 26, 2020

(54) APPARATUS AND METHOD FOR ESTIMATING STATE OF HEALTH (SOH) OF BATTERY, AND APPARATUS AND METHOD FOR GENERATING SOH ESTIMATION MODEL

(71) Applicant: Samsung Electronics Co., Ltd., Suwon-si (KR)

(72) Inventors: Kae Weon You, Hwaseong-si (KR); Sang Do Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 338 days.

(21) Appl. No.: 15/292,473

(22) Filed: Oct. 13, 2016

(65) Prior Publication Data

US 2017/0123009 A1    May 4, 2017

(30) Foreign Application Priority Data

Oct. 30, 2015   (KR) .................. 10-2015-0152462

(51) Int. Cl.
| | | |
|---|---|---|
| *G01R 31/367* | (2019.01) | |
| *B60L 58/16* | (2019.01) | |
| *G01R 31/392* | (2019.01) | |
| *B60L 58/12* | (2019.01) | |

(52) U.S. Cl.
CPC ............ *G01R 31/367* (2019.01); *B60L 58/12* (2019.02); *B60L 58/16* (2019.02); *G01R 31/392* (2019.01); *B60L 2240/545* (2013.01); *B60L 2240/547* (2013.01); *B60L 2240/549* (2013.01); *B60L 2240/80* (2013.01); *B60L 2260/44* (2013.01); *Y02T 10/705* (2013.01); *Y02T 10/7005* (2013.01); *Y02T 10/7044* (2013.01)

(58) Field of Classification Search
CPC ............ G01R 31/3651; G01R 31/3679; B60L 11/1857; B60L 11/1861; B60L 2260/44; B60L 2240/80; B60L 2240/549; B60L 2240/547; B60L 2240/545
USPC .......................................... 324/426; 702/63
See application file for complete search history.

(56) References Cited

U.S. PATENT DOCUMENTS

| | | | |
|---|---|---|---|
| 7,684,942 B2 | 3/2010 | Yun et al. | |
| 8,008,891 B2 * | 8/2011 | Yun ..................... | G01R 31/3842 320/132 |
| 8,258,751 B2 | 9/2012 | Esnard | |
| 8,937,459 B2 * | 1/2015 | Park ..................... | H02J 7/0052 320/149 |
| 2011/0112781 A1 * | 5/2011 | Anderson ........... | G01R 31/3679 702/63 |

(Continued)

FOREIGN PATENT DOCUMENTS

| | | |
|---|---|---|
| JP | 2007-78506 A | 3/2007 |
| JP | 5694088 B2 | 2/2015 |

(Continued)

*Primary Examiner* — Farhana A Hoque
(74) *Attorney, Agent, or Firm* — NSIP Law

(57) ABSTRACT

Provided are an apparatus and method for estimating a State of Health (SOH) of a battery, and an apparatus and method for generating an SOH estimation model. The apparatus for estimating an SOH of a battery includes a processor configured to divide sensed data of the battery into one or more regions; and estimate the SOH of the battery by applying different SOH estimation models to the one or more divided regions.

15 Claims, 8 Drawing Sheets

(56) References Cited

U.S. PATENT DOCUMENTS

| | | | |
|---|---|---|---|
| 2013/0069660 A1 | 3/2013 | Bernard et al. | |
| 2013/0093383 A1* | 4/2013 | Kim | H02J 7/0026 |
| | | | 320/107 |
| 2014/0009123 A1* | 1/2014 | Park | H02J 7/0052 |
| | | | 320/152 |
| 2014/0184233 A1 | 7/2014 | Nam | |
| 2015/0331053 A1* | 11/2015 | Depond | G01R 31/3648 |
| | | | 324/426 |
| 2016/0033582 A1 | 2/2016 | You et al. | |

FOREIGN PATENT DOCUMENTS

| | | |
|---|---|---|
| KR | 10-0839385 B1 | 6/2008 |
| KR | 10-2014-0084823 A | 7/2014 |
| KR | 10-1488828 B1 | 2/2015 |
| KR | 10-2015-004839 A | 5/2015 |

\* cited by examiner

APPARATUS AND METHOD FOR ESTIMATING STATE OF HEALTH (SOH) OF BATTERY, AND APPARATUS AND METHOD FOR GENERATING SOH ESTIMATION MODEL

CROSS-REFERENCE TO RELATED APPLICATION(S)

This application claims the benefit under 35 U.S.C. § 119(a) of Korean Patent Application No. 10-2015-0152462, filed on Oct. 30, 2015, in the Korean Intellectual Property Office, the entire disclosure of which is incorporated herein by reference for all purposes.

BACKGROUND

1. Field

The following description relates to an apparatus and method for estimating a State of Health (SOH) of a battery and to an apparatus and method for generating an SOH estimation model.

2. Description of the Related Art

With a growing significance of the environment and conservation of energy resources, electric vehicles are attracting attention as next-generation vehicles. Electric vehicles use a battery pack in which a plurality of rechargeable batteries are arranged in a single pack as a main power source. Thus, electric vehicles do not generate exhaust gas and create very little noise.

Batteries of the electric vehicle function as an engine and a fuel tank of a gasoline vehicle. For this reason, it is important to check the State of Health (SOH) of batteries.

SUMMARY

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

In one general aspect, there is provided an apparatus to estimate a state of health (SOH) of a battery, the apparatus including a processor configured to divide sensed data of the battery into one or more regions, and estimate the SOH of the battery by applying different SOH estimation models to the one or more divided regions.

The processor may include a divider configured to divide the sensed data of the battery into the one or more regions, and an estimator configured to estimate the SOH of the battery by applying the different SOH estimation models to the one or more divided regions.

The sensed data may include any one or any combination of voltage, current, temperature, charge/discharge time of the battery.

The divider may include a data time-divider configured to time-divide the sensed data of the battery, and a region determiner configured to determine a voltage level of the time-divided data and to determine a region of the time-divided data based on the determined voltage level.

The data time-divider may be configured to time-divide the sensed data of the battery using a sliding window.

The region determiner may be configured to calculate a central tendency of the time-divided data, and to determine the voltage level of the time-divided data based on the calculated central tendency.

The different SOH estimation models may be generated by classifying the one or more divided regions according to voltage levels, and by training the classified regions for each of the voltage levels.

In another general aspect, there is provided an apparatus including a data collector configured to collect training data of a battery, a data time-divider configured to time-divide the collected training data, a data classifier configured to classify the time-divided training data according to voltage levels, and a model generator configured to generate the a state of health (SOH) estimation model for each of the voltage levels using the classified training data.

The data time-divider may be configured to time-divide the collected data using a sliding window.

The data classifier may be configured to calculate a central tendency of a voltage of the time-divided training data, and to classify the time-divided training data according to the voltage levels based on the calculated central tendency.

In another general aspect, there is provided a method to estimate a state of health (SOH) of a battery, the method including dividing sensed data of the battery into one or more regions, and estimating the SOH of the battery by applying different SOH estimation models to each of the one or more divided regions.

The sensed data may include any one or any combination of voltage, current, temperature, charge/discharge time of the battery.

The dividing may include time-dividing the sensed data of the battery, determining a voltage level of the time-divided data, and determining a region of the time-divided data based on the determined voltage level.

The time-dividing may include time-dividing the sensed data of the battery using a sliding window.

The determining of the voltage level may include calculating a central tendency of a voltage of the time-divided data, and determining the voltage level of the time-divided data based on the calculated central tendency.

The different SOH estimation models may be generated by classifying the one or more divided regions according to voltage levels, and by training the classified regions for each of the voltage levels.

The central tendency may include any one or any combination of arithmetic mean, average, weighted average, median, mode of the time-divided data.

Other features and aspects will be apparent from the following detailed description, the drawings, and the claims.

Figure 1:
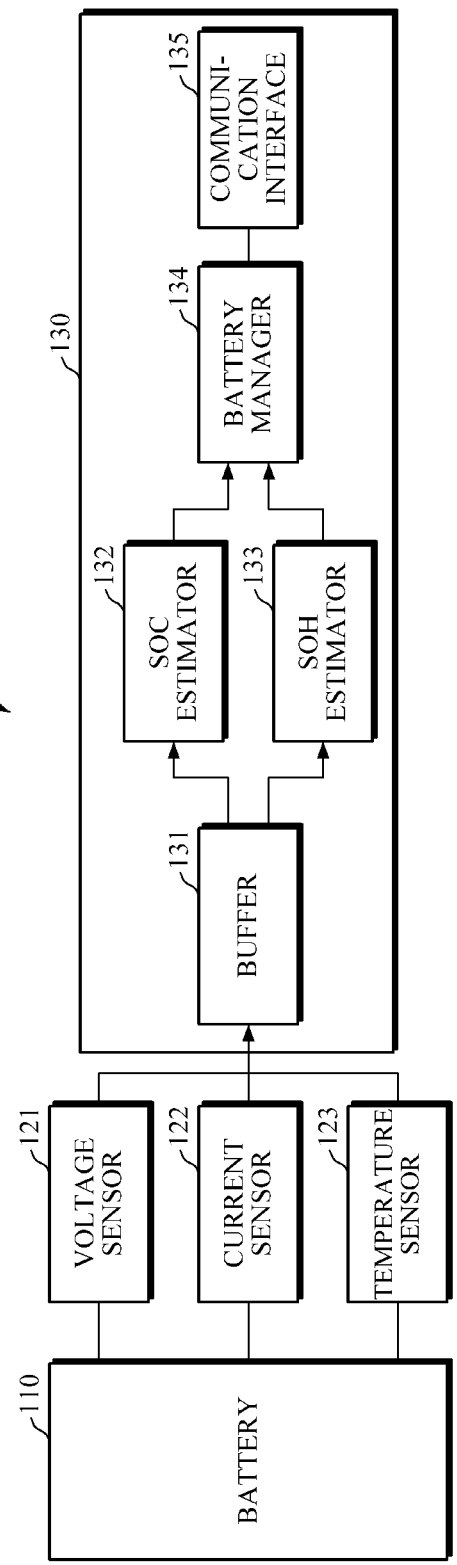
FIG. 1 is a diagram illustrating an example of a battery apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or apparatuses described herein. However, various changes, modifications, and equivalents of the methods, apparatuses, and/or apparatuses described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness The features described herein may be embodied in different forms, and are not to be construed as being limited to the examples described herein. Rather, the examples described herein have been provided merely to illustrate some of the many possible ways of implementing the methods, apparatuses, and/or apparatuses described herein that will be apparent after an understanding of the disclosure of this application.

FIG. 1 is a diagram illustrating an example of a battery apparatus. Referring to FIG. 1, the battery apparatus 100 includes a battery 110, a voltage sensor 121, a current sensor 122, a temperature sensor 123, and a battery management apparatus 130.

The battery 110 supplies power to devices mounted in the battery apparatus 100. The battery 110 may include a plurality of battery modules that are connected in series and/or in parallel, in which each battery module may include a plurality of battery cells. Each battery module or each battery cell may be a secondary battery such as a nickel metal battery and a lithium-ion battery. Other types of cells, such as, for example lithium-ion phosphate battery may be used without departing from the spirit and scope of the illustrative examples described. The capacity of battery modules or the capacity of battery cells may be identical to or different from each other.

In an example, the voltage sensor 121 senses a voltage applied to the battery 110, the current sensor 122 senses a current flowing to the battery 110, and the temperature sensor 123 senses temperature of the battery 110.

The battery management apparatus 130 may monitor the state of the battery 110, and may manage the battery 110 based on the monitored state. In an example, the battery management apparatus 130 includes a buffer 131, an SOC estimator 132, an SOH estimator 133, a battery manager 132, and a communication interface 135.

In an example, the buffer 131 temporarily stores data sensed by the voltage sensor 121, the current sensor 122, and the temperature sensor 123.

In an example, the SOC estimator 132 estimates a State of Charge (SOC) of the battery 110 based on the data sensed by the voltage sensor 121, the current sensor 122, and the temperature sensor 123. The SOC may indicate the quantity of electric charge of the battery 110.

In an example, the SOC estimator 132 estimates an SOC of the battery 110 using methods, such as, for example, Coulomb counting, an equivalent circuit model, an electro-chemical model, a data-based method. However, the SOC estimator 132 is not limited to such methods, which are merely illustrative, and the SOC estimator 132 may use other various methods to estimate an SOC of the battery 110.

In an example, the SOH estimator 133 estimates a State of Health (SOH) of the battery 110 by dividing the data, sensed by the voltage sensor 121, the current sensor 122, and the temperature sensor 123, into one or more regions, and by applying different SOH estimation models to the divided regions. The SOH may refer to information on how much performance of the battery 110 has deteriorated as compared to the performance of the battery at the time of manufacture.

In an example, the battery manager 134 controls the temperature of the battery 110 or controls the voltage or current of the battery 110 by controlling a cooling apparatus or a heating apparatus, so that the internal temperature and voltage may be maintained within a predetermined range. The battery manager 134 also prevents overcharging and over-discharging of the battery 110 based on the SOC and SOH. Further, the battery manager 134 performs cell balancing so that a charging state of battery modules included in the battery may be controlled to be equal. The battery manager performs various tasks to ensure high energy efficiency of a battery and longer battery life.

The communication interface 135 may transmit data such as, for example, the sensed data, the estimated SOC and SOH of a battery to external devices (e.g., electronic control unit). In an example, the communication interface 135 transmits data through a controller area network (CAN) communication in a vehicular environment. In other examples, the communication interface 135 uses any wireless communication or network communication consistent with that disclosed herein In an example, the battery management apparatus 130 may be embedded in or interoperate with various digital devices such as, for example, a mobile phone, a cellular phone, a smart phone, a wearable smart device (such as, for example, a ring, a watch, a pair of glasses, glasses-type device, a bracelet, an ankle bracket, a belt, a necklace, an earring, a headband, a helmet, a device embedded in the cloths), a personal computer (PC), a laptop, a notebook, a subnotebook, a netbook, or an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, a home appliance, content players, communication systems, image processing systems, graphics processing systems, other consumer electronics/information technology (CE/IT) device, or any other device capable of wireless communication or network communication consistent with that disclosed herein. The digital devices may be may be embedded in or interoperate with a smart appliance, an intelligent vehicle, an electric vehicle, a hybrid vehicle, a smart home environment, or a smart building environment.

Figure 2:
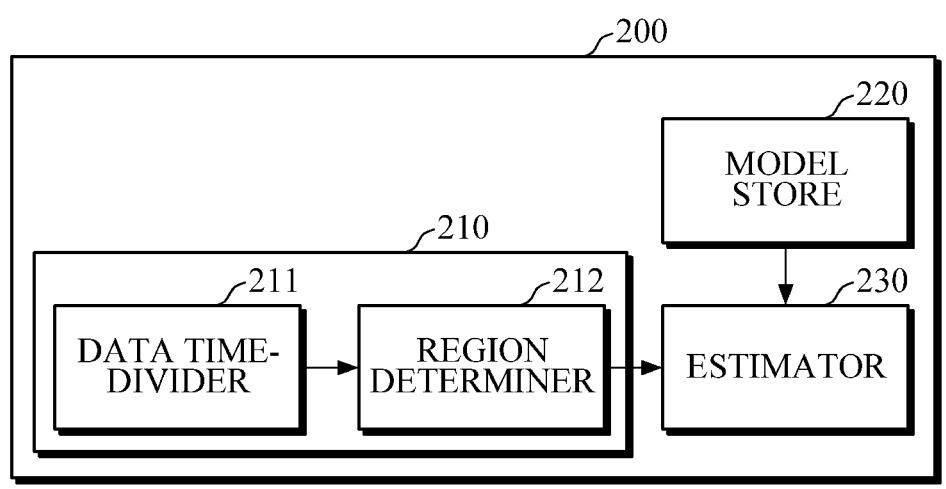
FIG. 2 is a diagram illustrating an example of an apparatus for estimating an SOH of a battery.

FIG. 2 is a diagram illustrating an example of an apparatus for estimating an SOH of a battery. The apparatus 200 for estimating an SOH of a battery (hereinafter referred to as an "SOH estimation apparatus") may be an example of the SOH estimator 133 illustrated in FIG. 1. Referring to FIG.

2, the SOH estimation apparatus 200 includes a divider 210, a model store 220, and an estimator 230.

The divider 210 may divide the sensed data of a battery into one or more regions according to data values. The sensed data of a battery may include data, such as, for example, voltage, current, temperature, or charge/discharge time of a battery. Each divided region may refer to a data section to which an identical SOH estimation model is applied. The divider 210 may divide the sensed data into regions, each of which is a data section to which an identical SOH estimation model is applied.

In an example, the divider 210 includes a data time-divider 211 and a region determiner 212.

The data time-divider 211 time-divides the sensed data of a battery. In an example, the data time-divider 211 may time-divide the sensed data using a sliding window, in which the sliding window may be units in which data is processed. Time division of data will be described in more details with reference to FIG. 3.

The region determiner 212 determines a voltage level of the data time-divided by the data time-divider 211. In an example, the region determiner 212 calculates a central tendency (e.g., arithmetic mean, weighted average, median value, mode, etc.), and determines a voltage level of the time-divided data based on the calculated central tendency. Each voltage level may be set in various ranges according to performance and purpose of use of an apparatus. For example, assuming that a first voltage level is set in a range of 3.8 V to 4.2 V; a second voltage level is set in a range of 3.4 V to 3.8 V; a third voltage level is set in a range of 3.0 V to 3.4 V; and the calculated central tendency of a voltage of the time-divided data is 3.92 V, the region determiner 212 may determine the voltage level of the time-divided data to be the first voltage level.

In an example, the region determiner 212 determines a region of the time-divided data based on the determined voltage level. In an example, the region determiner 212 determines that the plurality of time-divided data, which belong to the same voltage level, are in the same region. For example, in the case where the voltage level of first time-divided data is the first voltage level, the voltage level of second time-divided data is the third voltage level, the voltage level of third time-divided data is the first voltage level, and the voltage level of fourth time-divided data is the second voltage level, the region determiner 212 may determine a region of the first time-divided data and the third time-divided data to be a first region corresponding to the first voltage level. The region determiner 212 a region of the second time-divided data to be a third region corresponding to the third voltage level. The region determiner 212 a region of the fourth time-divided data to be a second region corresponding to the second voltage level.

In an example, the model store 220 stores a plurality of SOH estimation models, which may be SOH estimation models that are trained in advance for each voltage level. The plurality of SOH estimation models may be generated in such a manner that training data for various battery operation circumstances is time-divided, the time-divided training data is classified according to voltage levels, and the training data, which is classified according to the voltage levels, is trained for each of the voltage levels. In this case, the time-division of the training data may be performed using a sliding window, as in the case of the time-division of data performed by the data time-divider 211. Learning algorithm may include algorithms such as, for example, neural network, decision tree, generic algorithm (GA), genetic programming (GP), Gaussian process regression, Linear Discriminant Analysis, K-nearest Neighbor (K-NN), Perceptron, Radial Basis Function Network, Support Vector Machine (SVM), and deep-learning.

The model store 220 may include at least one of various types of storage media, such as, for example, flash memory, hard disk, multimedia card micro type storage medium, card-type memory (e.g., SD or XD memory), RAM, static RAM (SRAM), ROM, electrically erasable ROM (EEPROM), programmable ROM (PROM), magnetic memory, magnetic disk, optical data storage devices, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions.

The estimator 230 may estimate an SOH of a battery by applying different SOH estimation models to the divided regions. In an example, the estimator 230 estimates the SOH of a battery by selecting and applying an SOH estimation model to be applied to each divided region from among the plurality of SOH estimation models. For example, the first time-divided data and the third time-divided data are determined to belong to a first region corresponding to the first voltage level, the second time-divided data is determined to belong to a third region corresponding to the third voltage level, and the fourth time-divided data is determined to belong to a second region corresponding to the second voltage level. In an example, the estimator 230 selects and applies a first SOH estimation model, corresponding to the first voltage level, to the first time-divided data and the third time-divided data that belong to the first region. In an example, the estimator 230 selects and applies a second SOH estimation model, corresponding to the second voltage level, to the fourth time-divided data that belongs to the second region. In an example, the estimator 230 selects and applies a third SOH estimation model, corresponding to the third voltage level, to the second time-divided data that belongs to the third region.

Figure 3:
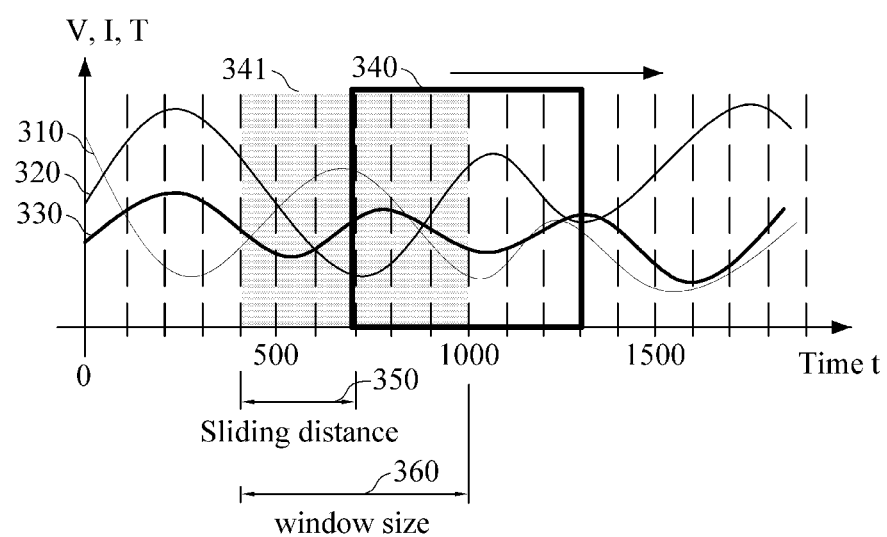
FIG. 3 is a explaining an example of time-division of data.

FIG. 3 is a diagram illustrating an example of time-division of data. Referring to FIGS. 2 and 3, the horizontal axis of the graph may represent time, and the vertical axis may represent voltage, current, and temperature of a battery.

The data time-divider 211 may time-divide temperature data 310, voltage data 320, and current data 330 using a sliding window 340. The sliding window 340 may be units in which the data 310, 320, and 330 are processed. A plurality of data in the sliding window 340 constitute a data set, which may be processed at the same time when the SOH model is generated or estimated.

The sliding window 340 has a predetermined window size 360, and may move a predetermined sliding distance 350 from left to right of the graph with the lapse of time. In an example, the sliding distance 350 of the sliding window 340 may be smaller than the window size 360. The reference numeral 341 indicates the position of the sliding window 340 before moving.

In the example of FIG. 3, the sliding window 340 has a window size of 600 seconds, and its moving distance is 300 seconds, but the window size and moving distance may be set to have other values based on factors such as, for example, performance and purpose of use of an apparatus, without departing from the spirit and scope of the illustrative examples described.

The region determiner 212 may determine a region of data in the sliding window 340 by determining a voltage level of the time-divided data, i.e., data in the sliding window 340. The estimator 230 may estimate an SOH of a battery by selecting an SOH estimation model, corresponding to the determined region, from among a plurality of SOH estimation models, and by applying the selected SOH estimation model to the data in the sliding window 340.

Figure 4:
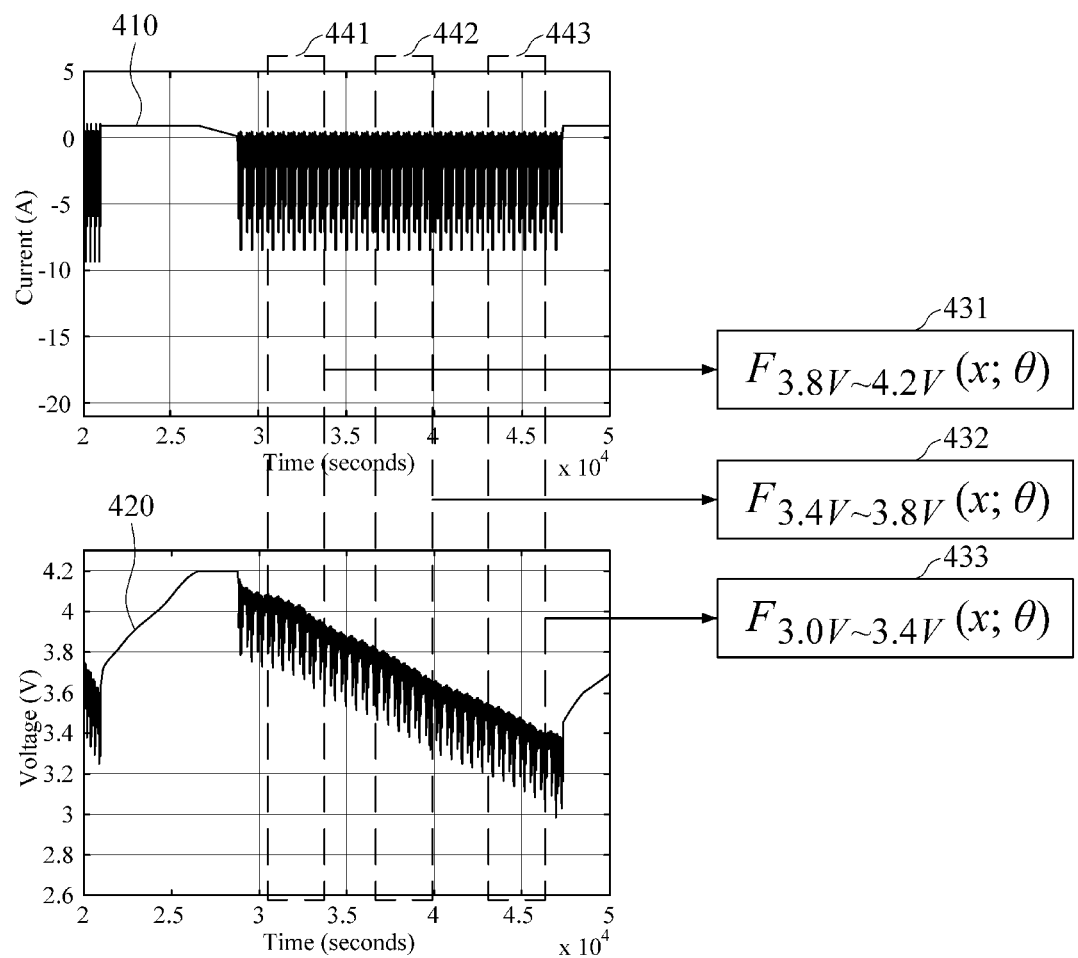
FIG. 4 is a diagram explaining an example of a method of estimating an SOH of a battery.

FIG. 4 is a diagram illustrating an example of a method of estimating an SOH of a battery. The reference numeral 431 represents the first SOH estimation model generated based on training data for the first voltage level in a range of 3.8 V to 4.2 V. The reference numeral 432 represents the second SOH estimation model generated based on training data for the second voltage level in a range of 3.4 V to 3.8 V. The reference numeral 433 represents the third estimation model generated based on training data for the third voltage level in a range of 3.0 V to 3.4 V. The reference numerals 441 to 443 represent positions of the sliding window used to time-divide the sensed current data 410 and the sensed voltage data 420 of a battery, in which the sliding window moves from the position 441 to the position 443 with the lapse of time.

Referring to FIGS. 2 and 4, when the sliding window 441 is located at the position 441, the region determiner 212 calculates the central tendency of the voltage data in the sliding window. As the calculated central tendency is determined to be the first voltage level (3.8 V to 4.2 V), the region determiner 212 determines that data in the sliding window belongs to the first region corresponding to the first voltage level. The estimator 230 selects a first SOH estimation model 431, corresponding to the first voltage level (3.8 V to 4.2 V), from among a plurality of SOH estimation models 431 to 433. The estimator 230 estimates the SOH of a battery by recognizing patterns of the current data and the voltage data using the first SOH estimation model 431.

When the sliding window moves to the position 442 with the lapse of time, the region determiner 212 calculates the central tendency of the voltage data in the sliding window. As the calculated central tendency is determined to be the second voltage level (3.4 V to 3.8 V), the region determiner 212 determines that data in the sliding window belongs to the second region corresponding to the second voltage level. The estimator 230 selects a second SOH estimation model 432, corresponding to the second voltage level (3.4 V to 3.8 V), from among a plurality of SOH estimation models 431 to 433. The estimator 230 estimates the SOH of a battery by recognizing patterns of the current data and the voltage data using the second SOH estimation model 432.

In the case where the sliding window moves to the position 443 with the lapse of time, the region determiner 212 calculates the central tendency of the voltage data in the sliding window. Then, as the calculated central tendency is determined to be the third voltage level (3.0 V to 3.4 V), the region determiner 212 determines that data in the sliding window belongs to the third region corresponding to the third voltage level. Subsequently, the estimator 230 selects a third SOH estimation model 433, corresponding to the third voltage level (3.0 V to 3.4 V), from among a plurality of SOH estimation models 431 to 433, and estimates the SOH of a battery by recognizing patterns of the current data and the voltage data using the third SOH estimation model 433.

Figure 5:
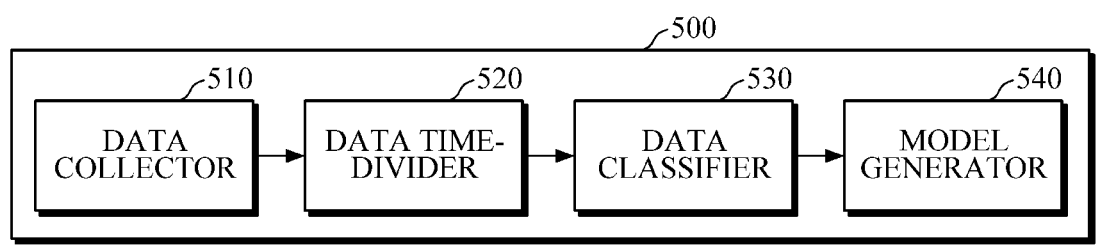
FIG. 5 is a diagram illustrating an example of an apparatus for generating an SOH estimation model.

FIG. 5 is a diagram illustrating an example of an apparatus for generating an SOH estimation model. The apparatus 500 for generating an SOH estimation model may generate an SOH estimation model for the SOH estimation apparatus 200. Referring to FIG. 5, the apparatus for generating an SOH estimation model 500 includes a data collector 510, a data time-divider 520, a data classifier 530, and a model generator 540.

The data collector 510 collects training data of a battery sensed by sensors under various battery operation circumstances. The training data may include data such as, for example, voltage, current, temperature, or charge/discharge time of the battery.

The data time-divider 520 may time-divide the collected training data. In an example, the data time-divider 520 time-divides the collected training data using a sliding window. The method of time-dividing the training data performed by the data time-divider 520 is the same as the method of time-dividing the sensed data performed by the data time-divider 211 (see FIG. 2), such that the above descriptions of data time-divider 211, are also applicable to data time-divider 520, and are incorporated herein by reference. Thus, the above description may not be repeated here.

The data classifier 530 may classify the time-divide training data according to voltage levels. In an example, the data classifier 530 calculates a central tendency such as, for example, arithmetic mean, weighted average, median value, mode, of a voltage of the time-divided training data, and may classify the time-divided training data according to voltage levels based on the calculated central tendency. Each voltage level may be set in various ranges according to performance and purpose of use of an apparatus.

The model generator 540 generates an SOH estimation model for each voltage level by training using the training data classified according to voltage levels. In an example, the model generator 540 may generate the SOH estimation model using any one or more of the various machine learning algorithms described above.

Figure 6:
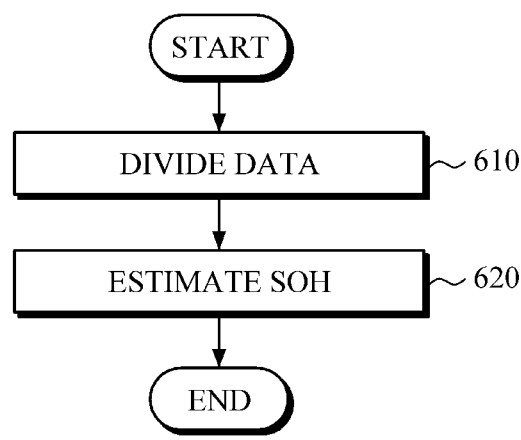
FIG. 6 is a diagram illustrating an example of a method of generating an SOH estimation model.

FIG. 6 is a diagram illustrating an example of a method of generating an SOH estimation model. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. In addition to the description of FIG. 6 below, the above descriptions of FIGS. 1-5, are also applicable to FIG. 6, and are incorporated herein by reference. Thus, the above description may not be repeated here.

Referring to FIGS. 2 and 6, in 610, the SOH estimation apparatus 200 divides the sensed data of a battery into one or more regions according to the data values. An identical SOH estimation model is applied to each divided region. The SOH estimation apparatus 200 may divide the sensed data into regions, each of which is a data section to which an identical SOH estimation model is applied.

In 620, the SOH estimation apparatus 200 estimates the SOH of a battery by applying different SOH estimation models to the divided regions. For example, the SOH estimation apparatus 200 may estimate the SOH of a battery by selecting an SOH estimation model to be applied to each divided region from among the plurality of SOH estimation models, and by applying the selected SOH estimation model to each divided region. The plurality of SOH estimation models may be SOH estimation models that are trained in advance for each voltage level. In an example, the plurality of SOH estimation models are generated in such a manner that training data for various battery operation circumstances is time-divided, the time-divided training data is classified according to voltage levels. The training data, which is classified according to voltage levels, is trained for each voltage level. In as example the time-division of the training data may be performed using a sliding window, as in the case of the time-division of data performed by the SOH estimation apparatus 200.

Figure 7:
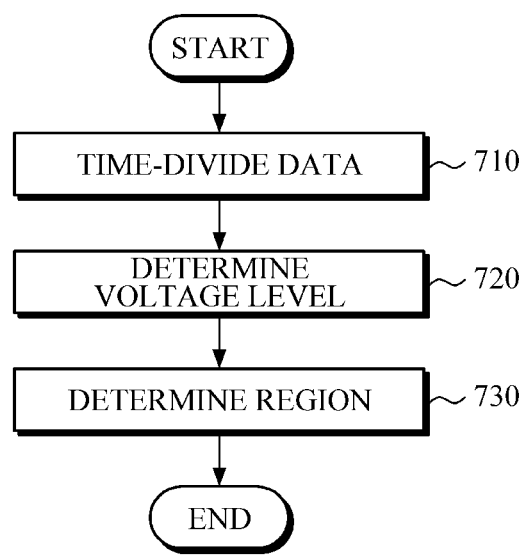
FIG. 7 is a diagram illustrating an example of a method of dividing battery data sensed by sensors.

FIG. 7 is a diagram illustrating an example of a method of dividing the sensed data of a battery. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. In addition to the description of FIG. 7 below, the above descriptions of FIGS. 1-6, are also applicable to FIG. 7, and are incorporated herein by reference. Thus, the above description may not be repeated here.

The method of dividing the sensed data of a battery illustrated in FIG. 7 may be an example of the dividing of data in 620 of FIG. 6.

Referring to FIGS. 2 and 7, in 710, the SOH estimation apparatus 200 time-divides the sensed data of a battery. For example, the SOH estimation apparatus 200 may time-divide the sensed data using a sliding window, in which the sliding window may be units in which data is processed.

The SOH estimation apparatus 200 determines a voltage level of the time-divided data in 720. For example, the SOH estimation apparatus 200 may calculate a central tendency, such as, for example, arithmetic mean, weighted average, median value, or mode, of a voltage of the time-divided data, and may determine a voltage level of the time-divided data based on the calculated central tendency. Each voltage level may be set in various ranges according to performance and purpose of use of an apparatus.

In 730, the SOH estimation apparatus 200 may determine a region of the time-divided data based on the determined voltage level. For example, a plurality of time-divided data, which belong to the same voltage level, may be determined to be in the same region.

Figure 8:
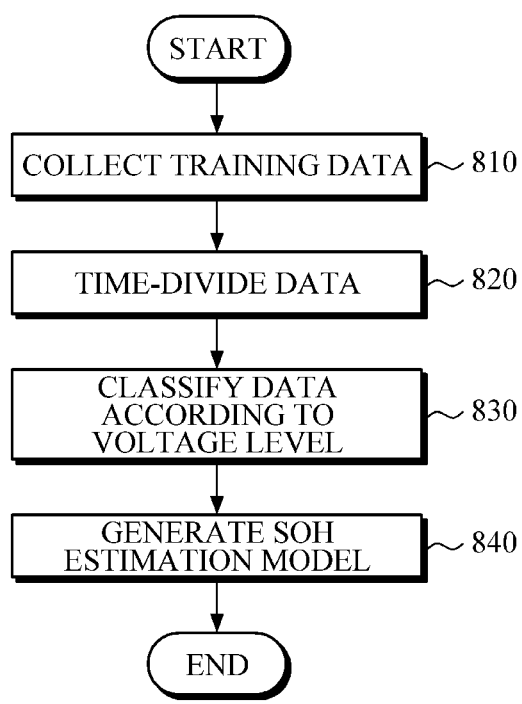
FIG. 8 is a diagram illustrating an example of a method of generating an SOH estimation model.

FIG. 8 is a diagram illustrating an example of a method of generating an SOH estimation model. The operations in FIG. 8 may be performed in the sequence and manner as shown, although the order of some operations may be changed or some of the operations omitted without departing from the spirit and scope of the illustrative examples described. Many of the operations shown in FIG. 8 may be performed in parallel or concurrently. In addition to the description of FIG. 8 below, the above descriptions of FIGS. 1-7, are also applicable to FIG. 8, and are incorporated herein by reference. Thus, the above description may not be repeated here.

Referring to FIGS. 5 and 8, in 810, the apparatus 500 for generating an SOH estimation model may collect the sensed training data of a battery under various battery operation circumstances.

In 820, the apparatus 500 for generating an SOH estimation model may time-divide the collected training data. For example, the apparatus 500 for generating an SOH estimation model may time-divide the collected training data using a sliding window.

In 830, the apparatus 500 for generating an SOH estimation model may classify the time-divide training data according to voltage levels. In an example, the apparatus 500 for generating an SOH estimation model may calculate a central tendency, such as, for example, arithmetic mean, weighted average, median value, or mode of a voltage of the time-divided training data, and may classify the time-divided training data according to voltage levels based on the calculated central tendency. Each voltage level may be set in various ranges according to performance and purpose of use of an apparatus.

The apparatus 500 for generating an SOH estimation model generates an SOH estimation model for each voltage level by using the training data classified according to voltage levels. In an example, the apparatus 500 for generating an SOH estimation model may generate the SOH estimation model using any one or more of the various machine learning algorithms described above.

The battery apparatus 100, battery management apparatus 130, battery management apparatus 130, SOC estimator 132, SOH estimator 133, battery manager 132, communication interface 135, SOH estimation apparatus 200, divider 210, estimator 230, apparatus for generating an SOH estimation model 500, data collector 510, data time-divider 520, data classifier 530, and model generator 540 described in FIGS. 1-2 and 5 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing The methods illustrated in FIGS. 6-8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An apparatus to estimate a state of health (SOH) of a battery, the apparatus comprising:
   a data time-divider, implemented by a processor or a computer, configured to time-divide sensed data of the battery to generate a plurality of data sets, the sensed data comprising voltage;
   a voltage determiner, implemented by a processor or a computer, configured to determine voltage level of each data set;
   a model selector, implemented by a processor or a computer, configured to select a SOH estimation model for a corresponding data set, from among a plurality of SOH estimation models, based on the determined voltage level; and
   an SOH estimator, implemented by a processor or a computer, configured to estimate the SOH of the battery by applying the selected SOH estimation model to the corresponding data set, wherein the SOH estimation models are different for different voltage levels.

2. The apparatus of claim 1, wherein the sensed data further comprises any one or any combination of current, temperature, and charge/discharge time of the battery.

3. The apparatus of claim 1, wherein the processor is further configured to time-divide the sensed data of the battery using a sliding window.

4. The apparatus of claim 1, wherein the processor is further configured to calculate a central tendency of the voltage of each data set, and to determine voltage level of each data set based on the calculated central tendency.

5. The apparatus of claim 1, wherein the SOH estimation models are generated by classifying time-divided training data according to voltage levels, and by training the classified training data for each of the voltage levels.

6. An apparatus comprising:
   a data collector, implemented by a processor or a computer, configured to collect training data of a battery;
   a data time-divider, implemented by a processor or a computer, configured to time-divide the collected training data;
   a data classifier, implemented by a processor or a computer, configured to classify the time-divided training data according to voltage levels; and
   a model generator, implemented by a processor or a computer, configured to generate a state of health (SOH) estimation model for each of the voltage levels using the classified training data, wherein the SOH estimation models are different for different voltage levels.

7. The apparatus of claim 6, wherein the data time-divider is further configured to time-divide the collected data using a sliding window.

8. The apparatus of claim 6, wherein the data classifier is further configured to calculate a central tendency of the voltage of the time-divided training data, and to classify the time-divided training data according to the voltage levels based on the calculated central tendency.

9. A method to estimate a state of health (SOH) of a battery employing a data time-divider implemented by a processor or a computer, a voltage determiner implemented by a processor or a computer, a model selector implemented by a processor or a computer, and an SOH estimator implemented by a processor or a computer, the method comprising:

time-dividing, using the data time-divider, sensed data of the battery to generate a plurality of data sets, the sensed data comprising voltage;

determining, using the voltage determiner, voltage level of each data set;

selecting, using the model selector, a SOH estimation model for a corresponding data set, from among a plurality of SOH estimation models, based on the determined voltage level; and estimating, using the SOH estimator, the SOH of the battery by applying the selected SOH estimation model to the corresponding data set, wherein the SOH estimation models are different for different voltage levels.

10. The method of claim 9, wherein the sensed data further comprises any one or any combination of voltage, current, temperature, and charge/discharge time of the battery.

11. The method of claim 9, wherein the time-dividing comprises time-dividing the sensed data of the battery using a sliding window.

12. The method of claim 9, wherein the determining of voltage level comprises:

calculating a central tendency of the voltage of each data set; and determining the voltage level of each data set based on the calculated central tendency.

13. The method of claim 12, wherein the central tendency comprises any one or any combination of parameters selected from the group consisting of arithmetic mean, average, weighted average, median, and mode of the time-divided data.

14. The method of claim 9, wherein the SOH estimation models are generated by classifying time-divided training data according to voltage levels, and by training the classified training data for each of the voltage levels.

15. A non-transitory computer-readable storage medium storing instructions that, when executed by a processor, cause the processor to perform the method of claim 9.

* * * * *